(12) United States Patent
Niwa

(10) Patent No.: US 7,859,293 B2
(45) Date of Patent: Dec. 28, 2010

(54) SEMICONDUCTOR INTEGRATED CIRCUIT

(75) Inventor: Yasuyuki Niwa, Chiba (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 12/354,203

(22) Filed: Jan. 15, 2009

(65) Prior Publication Data

US 2009/0183043 A1 Jul. 16, 2009

(30) Foreign Application Priority Data

Jan. 16, 2008 (JP) .............................. 2008-007230

(51) Int. Cl.
*H03K 19/00* (2006.01)
*G01R 31/28* (2006.01)
*G11C 29/00* (2006.01)

(52) U.S. Cl. .................. 326/16; 714/724; 714/729; 714/734; 365/201

(58) Field of Classification Search .................. 326/16, 326/17; 714/724, 726–727, 729, 734; 365/201
See application file for complete search history.

(56) References Cited

U.S. PATENT DOCUMENTS

| 5,717,702 | A  | * | 2/1998  | Stokes et al. .................. 714/730 |
| 6,219,288 | B1 | * | 4/2001  | Braceras et al. ............. 365/201 |
| 6,239,611 | B1 | * | 5/2001  | Matera ........................ 326/16 |
| 6,539,497 | B2 | * | 3/2003  | Swoboda et al. ............. 714/30 |
| 6,813,738 | B2 | * | 11/2004 | Whetsel, Jr. ................ 714/727 |
| 7,007,215 | B2 | * | 2/2006  | Kinoshita et al. ........... 714/745 |
| 7,545,691 | B2 | * | 6/2009  | Turgis et al. ................ 365/201 |
| 7,607,057 | B2 | * | 10/2009 | Boike et al. ................. 714/727 |
| 7,613,972 | B2 | * | 11/2009 | Takeoka et al. ............. 714/731 |
| 2003/0154434 | A1 | * | 8/2003 | Hou ........................... 714/734 |
| 2005/0156622 | A1 | * | 7/2005 | Roziere et al. ............... 326/16 |
| 2005/0246599 | A1 | * | 11/2005 | Simpson et al. ............ 714/724 |
| 2007/0262787 | A1 | * | 11/2007 | Chakraborty et al. ......... 326/16 |
| 2007/0266282 | A1 | * | 11/2007 | Chakraborty et al. ....... 714/726 |
| 2008/0005634 | A1 | * | 1/2008 | Grise et al. ................. 714/726 |
| 2009/0228752 | A1 | * | 9/2009 | Sawamura .................. 714/731 |

FOREIGN PATENT DOCUMENTS

JP        2000-258499       9/2000

* cited by examiner

*Primary Examiner*—James H. Cho
*Assistant Examiner*—Matthew C Tabler
(74) *Attorney, Agent, or Firm*—Oblon, Spivak, McClelland, Maier & Neustadt, L.L.P.

(57) ABSTRACT

A semiconductor integrated circuit includes a digital circuit and a first-stage register circuit provided in a stage followed by the digital circuit. The digital circuit includes a logic circuit and a register circuit configured to temporarily retain a logic output from the logic circuit. The first-stage register circuit has a function as an alternative configured to test at least one register circuit and a function as an interface which supplies input data from an external input terminal to the digital circuit. The first-stage register circuit retains the input data from the external input terminal in synchronization with a clock signal, supplies the retained data to the digital circuit at the time of system operation, and outputs the retained data from an external output terminal connected to a dedicated output terminal or the digital circuit at the time of testing.

9 Claims, 6 Drawing Sheets

SEMICONDUCTOR INTEGRATED CIRCUIT

CROSS-REFERENCE TO RELATED APPLICATIONS

This application is based upon and claims the benefit of priority from the prior Japanese Patent Application No. 2008-007230 filed in Japan on Jan. 16, 2008; the entire contents of which are incorporated herein by reference.

BACKGROUND OF THE INVENTION

1. Field of the Invention

The present invention relates to a semiconductor integrated circuit including a digital circuit which includes a logic circuit and a register circuit, the setup time and the hold time of which can be easily measured.

2. Description of Related Art

As seen in, for example, a system LSI, a conventional clock-synchronized digital circuit is configured in such a manner as described below. That is, at least one logic circuit is disposed in a stage following an input buffer connected to an input terminal. The output of that one logic circuit is temporarily retained by a register circuit configured with a flip-flop. Then, the logic output is further supplied to a subsequent register circuit through a subsequent logic circuit.

In a circuit having such a configuration as described above, data is loaded into a register circuit in synchronization with a rising or falling edge of a clock signal. This means that the register circuit is controlled from the outside by a clock signal input to the clock terminal thereof.

In the register circuit, the time required to load data is not zero. Therefore, the data must be fixed (stabilized) during certain periods of time before and after data loading. Part of the period before data loading (prior to the rising edge of a clock signal) is referred to as a setup time "t su", whereas part of the period after data loading (subsequent to the falling edge of the clock signal) is referred to as a hold time "t hold". The setup time "t su" is a minimum time during which input data must be stabilized before a valid edge of the clock signal is encountered in a register circuit or a latch circuit, in order to correctly read the input data. Likewise, the hold time "t hold" is a minimum time during which input data must be stabilized after a valid edge of the clock signal is encountered in the register circuit or the latch circuit, in order to correctly read the input data. This means that data must be fixed at least during a period of "t su+t hold" when data is loaded. If this requirement is ignored, the operation of a flip-flop is not guaranteed. Consequently, when data is input to the register circuit, it is necessary to verify (observe) the timing of data input/output with respect to a clock edge. An LSI tester is commonly used in order to verify the timing of data input/output with respect to the clock edge.

However, a conventional digital circuit is configured so that a plurality of complex logic circuits exists in a path from an input buffer to a first-stage register circuit. Since the first-stage register circuit configured to load logic outputs is located in a stage following the logic circuits, a wiring delay arises in each logic output due to the complex logic circuits in a preceding stage when data is loaded into the first-stage register circuit. It is therefore difficult to synchronize the timing of data with a rising or falling edge of the clock signal. It is also difficult to dispose means for directly observing the output of the first-stage register circuit located in a subsequent stage since the complex logic circuits exist in the preceding stage.

In a semiconductor integrated circuit of the related art, a switch circuit 3 is provided in the output section of a register circuit 2-1 provided in a stage following the input circuit 1-1 of a pin under measurement Di, as shown in, for example, Japanese Patent Application Laid-Open Publication No. 2000-258499. One contact of the switch circuit 3 is connected to the output of the register circuit 2-1 and the other contact is connected to a pin for judgment Do. The register circuits 2-1 and 2-2 are controlled by a clock signal C. A test mode signal TST is input when a test of the pin under measurement Di is conducted. Consequently, the switch circuit 3 goes to an on-state, thereby connecting the output of the register circuit 2-1 and the pin for judgment Do to each other through the switch circuit 3. Thus, the output of the register circuit 2-1 is obtained at the pin for judgment Do.

However, Japanese Patent Application Laid-Open Publication No. 2000-258499 specifically describes an input buffer and a register circuit connected to an address pin and an I/O pin used in a memory product. Thus, the invention described in Japanese Patent Application Laid-Open Publication No. 2000-258499 is not intended to observe the setup time "t su" and the hole time "t hold" of register circuits used in a plural number in a digital circuit configured with logic circuits and register circuits like the above-described system LSI.

BRIEF SUMMARY OF THE INVENTION

According to one aspect of the invention as claimed in the application concerned, there is provided a semiconductor integrated circuit includes:

a digital circuit which includes a logic circuit configured to perform logical operations on supplied data and a register circuit configured to temporarily retain a logic output from the logic circuit; and a first-stage register circuit provided in a stage followed by the digital circuit and having a function as an alternative circuit configured to test the register circuit and a function as an interface which supplies input data loaded from an external input terminal to the digital circuit in synchronization with an edge of a clock signal, wherein the loaded data is supplied to the digital circuit at the time of system operation or the loaded data is output to the external output terminal of the digital circuit through a dedicated output terminal or through a path bypassing the digital circuit at the time of testing.

DETAILED DESCRIPTION OF THE INVENTION

Now, embodiments of the present invention will be described with reference to the accompanying drawings.

Figure 6:
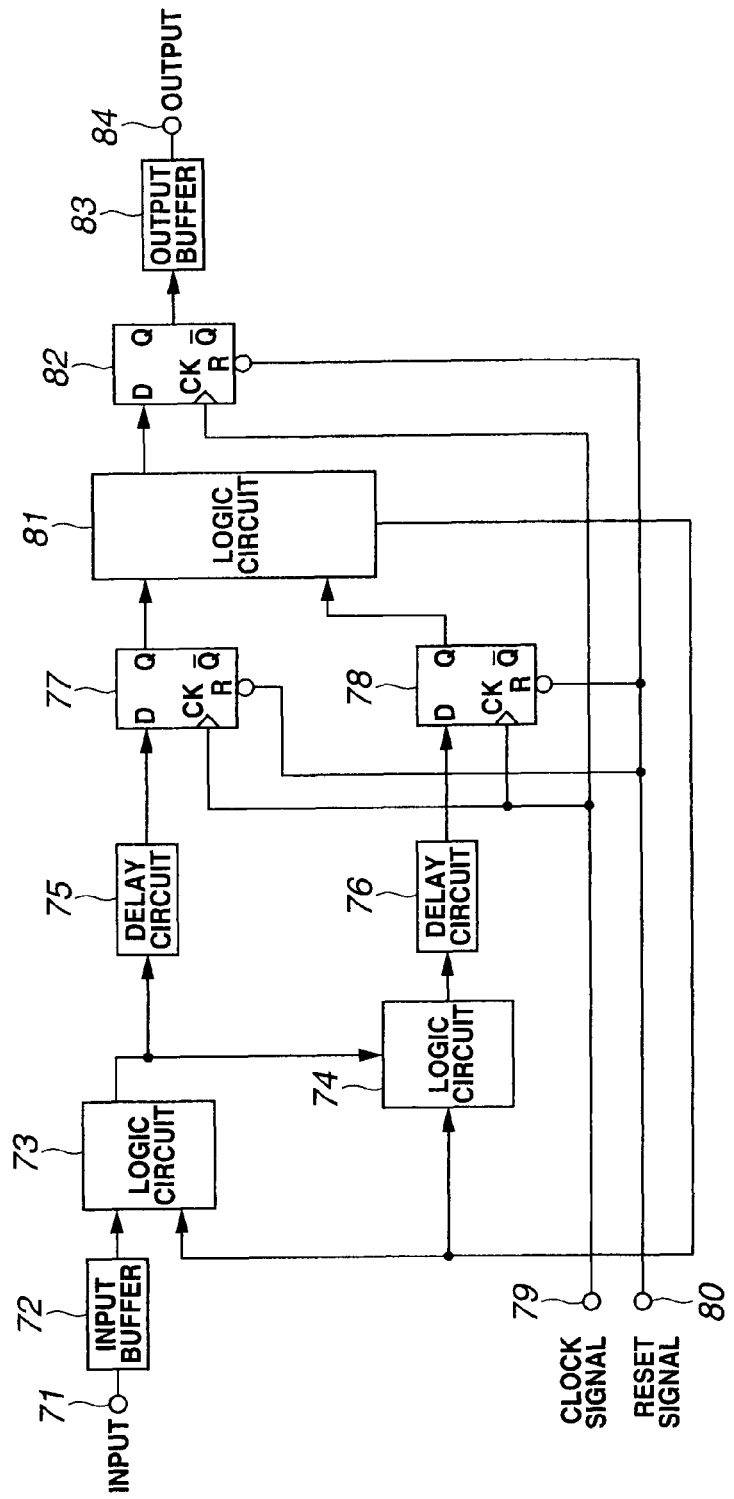
FIG. 6 is a block diagram showing a semiconductor integrated circuit according to a conventional example.

FIG. 6 shows a block diagram of a semiconductor integrated circuit according to a conventional example.

In FIG. 6, the semiconductor integrated circuit includes an external input terminal 71, an input buffer 72, logic circuits 73 and 74, delay circuits (hereinafter simply referred to as delays) 75 and 76, register circuits 77 and 78 configured with flip-flops, a clock signal input terminal 79, a reset signal input terminal 80, a logic circuit 81, a register circuit 82 configured with a flip-flop, an output buffer 83, and an external output terminal 84.

In the semiconductor integrated circuit having such a configuration as described above, data input from the external input terminal 71 goes through the input buffer 72, undergoes logical operations performed by the logic circuit 73, and is output therefrom. The output from the logic circuit 73 goes through the delay 75 and is temporarily retained in the first-stage register circuit 77. On the other hand, the output is subjected to logical operations performed by the logic circuit 74, is output therefrom, goes through the delay 76, and is temporarily retained in the register circuit 78. The outputs from the two register circuits 77 and 78 are further supplied to the logic circuit 81 to undergo logical operations, and then temporarily retained in the subsequent-stage register circuit 82. Then, the output of the register circuit 82 goes through the output buffer 83 and is output from the output terminal 84.

The logic circuits 73, 74 and 81 generally have a complex structure in which a plurality of gate circuits is combined. The delays 75 and 76 are inserted in order to adjust the timing (in time) of signals output from the two logic circuits 73 and 74, and then supply the signals to the next-stage register circuits 77 and 78.

Incidentally, in a product using register circuits, the setup time and the hold time thereof are generally described in a product catalog as parameters used to guarantee the operation of the register circuits. In the circuit configuration shown in FIG. 6, a path from the input buffer 72 to the first-stage register circuit 77 or register circuit 78 is formed by way of the logic circuit 73 and/or 74 having a complex configuration. Since the complex logic circuit exists in a stage followed by the register circuit 77 or the register circuit 78, it is difficult, in terms of layout, to directly observe the timing of data output from the first-stage register circuit 77 or 78. In addition, the product does not include a function to perform such observation.

As described above, a plurality of paths that pass through the logic circuits exists in a route from the input buffer to the first-stage register circuits. It is therefore difficult to make post-layout adjustments based on the delays, in order to secure the setup time and hold time of data in an input stage. This difficulty increases in proportion to the complexity of the logic circuits, thus leading to the prolongation of design time.

In addition, when measuring (verifying) a setup time and a hold time at the input stage, the internal state of an LSI must be subjected to transition until a state of data loading into the first-stage register circuit is reached and until a state of outputting data loaded into the first-stage register circuit from the LSI is reached. Thus, a complex test pattern is created to perform tests.

First Embodiment

Figure 1:
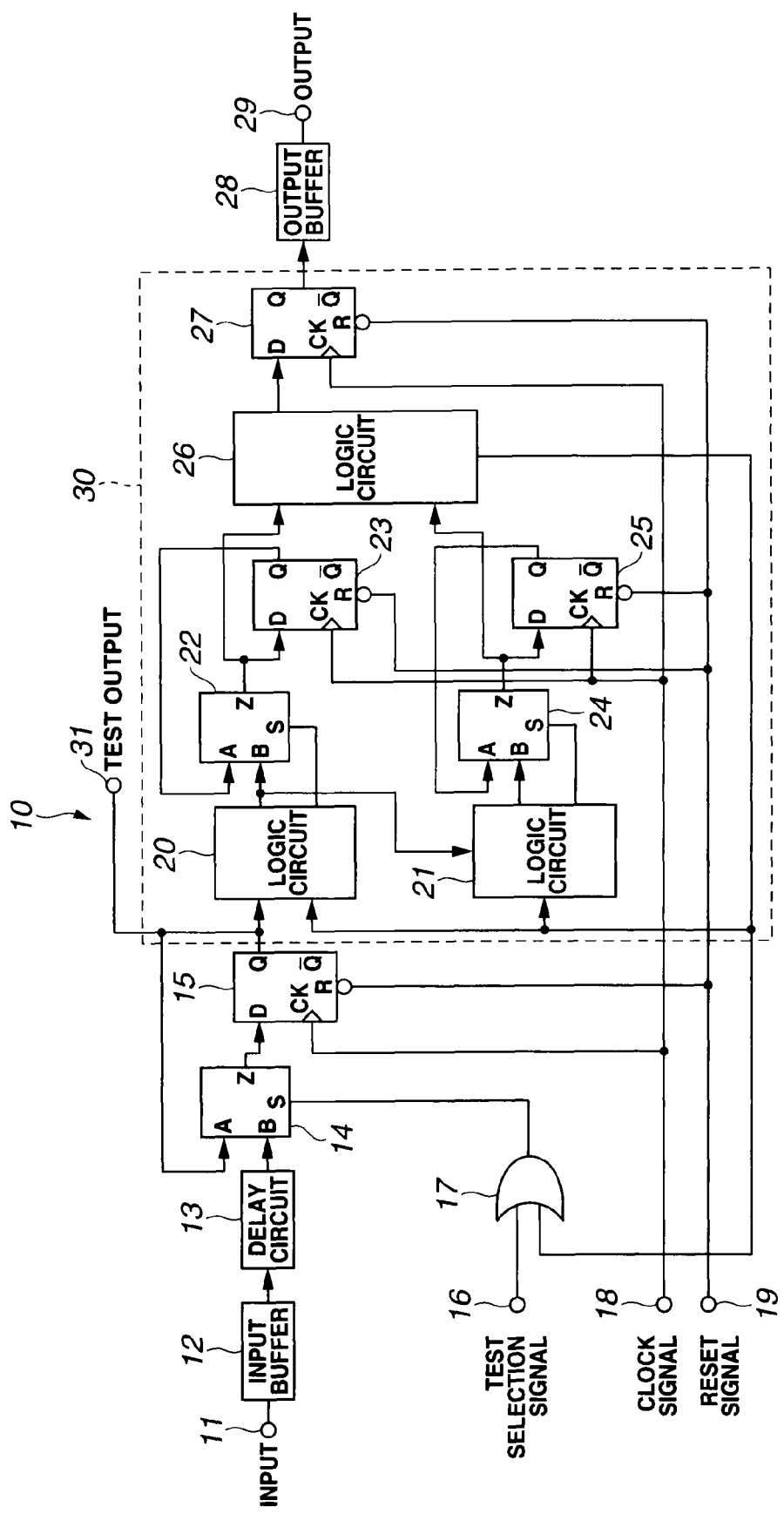
FIG. 1 is a block diagram showing a semiconductor integrated circuit according to a first embodiment of the present invention.

FIG. 1 shows a block diagram of a semiconductor integrated circuit according to a first embodiment of the present invention.

In FIG. 1, a semiconductor integrated circuit 10 includes an external input terminal 11 to which data is input, an input buffer 12, a delay 13, a two-input multiplexer 14, a first-stage register circuit 15 configured with a flip-flop, a test selection signal input terminal 16, a two-input OR gate 17 for selection signal generation, a clock signal input terminal 18, a reset signal input terminal 19, logic circuits 20 and 21, two-input multiplexers 22 and 24, register circuits 23 and 25 configured with flip-flops, a logic circuit 26, a register circuit 27 configured with a flip-flop, an output buffer 28, an external output terminal 29 from which data is output, and a dedicated output terminal 31 for test output.

For convenience of consideration, this semiconductor integrated circuit 10 can be divided into an input circuit section ranging from the external input terminal 11 to the delay 13 and the multiplexer 14, a section consisting of the first-stage register circuit 15, a section consisting of a digital circuit 30 which includes the dedicated output terminal 31 for test output, the logic circuits 20 and 21, the multiplexers 22 and 24, the register circuits 23 and 25, the logic circuit 26, and the register circuit 27, and an output circuit section including the output buffer 28 and the external output terminal 29.

The delay 13 is provided in order to make timing adjustments, so that when input data from the outside is loaded into the first-stage register circuit 15 in synchronization with an edge of a clock signal (hereinafter referred to as clock edge), it is possible to obtain a time margin (setup time) with which the input data can be correctly loaded and a time margin (hold time) with which the data can be correctly retained following the clock edge with respect to the clock edge.

The first-stage register circuit 15, which is provided in a stage followed by the digital circuit 30, has a function as an alternative configured to test the register circuits 23, 25 and 27 and a function as an interface which supplies the input data from the external input terminal 11 to the digital circuit 30. The first-stage register circuit 15 retains the input data from the external input terminal 11 in synchronization with the clock edge. At the time of system operation, the first-stage register circuit 15 supplies the retained data into the digital circuit 30. At the time of testing, the first-stage register circuit 15 outputs the retained data to the dedicated output terminal 31.

Note that at the time of testing, it is possible to measure a setup time and a hold time at the input stage by inputting test data output by an unillustrated LSI tester to the external input terminal 11 and observing output data from the dedicated output terminal 31 for test output connected to the output terminal Q of the first-stage register circuit 15 using the same LSI tester.

The digital circuit 30 includes the logic circuits 20, 21 and 26 and the register circuits 23, 25 and 27 configured to temporarily retain the respective logic outputs of these logic circuits 20, 21 and 26.

Each of the register circuits 15, 23, 25 and 27 includes a data input terminal D, an output terminal Q, an inverting output terminal /Q, a clock input terminal CK, and a reset terminal R. These register circuits have a function to load data to be input to the input terminal D at the timing of a clock edge and temporarily retain the data.

Each of the multiplexers 14, 22 and 24 includes two input terminals A and B, an output terminal Z and a selection signal input terminal S. If a selection signal is at a logical level "1", then the multiplexer electrically connects (i.e., short-circuits) the input terminal B to the output terminal Z. If the selection signal is at a logical level "0", then the multiplexer electrically connects the input terminal A to the output terminal Z. A request-to-load-data signal output from the logic circuit 26 and a test selection signal supplied from the outside are supplied to the two input ends of the OR gate 17. The output signal of the OR gate 17 is supplied to the selection signal input terminal S of the multiplexer 14 as a selection signal. The request-to-load-data signal supplied from the logic circuit 26 goes to a logical level "1" when new data is loaded from the outside, and goes to a logical level "0" when any new data is not loaded. The test selection signal input from the outside goes to a logical level "1" when tests are performed, and goes to a logical level "0" when any test is not performed.

Accordingly, when data is newly loaded or tests are performed (i.e., test data is input), the multiplexer 14 connects the input terminal B to the output terminal Z. Consequently, input data from the outside can be loaded into the first-stage register circuit 15 and supplied to the logic circuit 20 and to subsequent components within the digital circuit 30. On the other hand, the multiplexer 14 can output the input data from the dedicated output terminal 31 as a test output at the time of testing. In addition, when any new data is not loaded by a request from the logic circuit 26 and no tests are performed according to a test selection signal, the multiplexer 14 connects the input terminal A to the output terminal Z. Consequently, an output from the output terminal Q of the first-stage register circuit 15 is fed back through the terminal A of the multiplexer 14 to the input terminal D of the first-stage register circuit 15. Accordingly, data retained by the multiplexer 14 prior to switching remains latched by the first-stage register circuit 15. This means that the latched data (fixed value of either "0" or "1") keeps being supplied to the next-stage logic circuit 20. The output of the logic circuit 20 is supplied to the multiplexer 22, as well as to the logic circuit 21. The logic circuits 21 and 22 are respectively configured by combining gate circuits, and perform logical operations determined by the respective configurations of the logic circuits 21 and 22.

On the other hand, a selection signal output from the logic circuit 20 is supplied to the selection signal input terminal S of the multiplexer 22. Likewise, a selection signal output from the logic circuit 21 is supplied to the selection signal input terminal S of the multiplexer 24. A determination as to which of the two input terminals A and B is selected in each of the multiplexers 22 and 24 is made according to the content of a request signal output for selection purposes from the logic circuit 20 or 21. If "1" is supplied to the multiplexers 22 and 24 respectively as a selection signal S, then logic outputs from the logic circuits 20 and 21 are output from the terminals B of the multiplexers 22 and 24 through to the output terminals Z. The two output signals are directly supplied to the logic circuit 26 as inputs, without going through the register circuits 23 and 25. If "0" is supplied to the multiplexers 22 and 24 respectively as the selection signal S, then the input terminals A and the output terminals Z are connected to each other in the multiplexers 22 and 24. Consequently, outputs retained by the register circuits 23 and 25 prior to multiplexing are kept being fed back to the respective input terminals A of the multiplexers 22 and 24. Thus, latched data from the respective output terminals Q of the register circuits 23 and 25 are supplied to the logic circuit 26 as inputs. The logic circuit 26 is also configured by combining gate circuits, and performs logical operations determined by the configuration of the logic circuit 26. A logic output from the logic circuit 26 is loaded into the input terminal D of the final-stage register circuit 27 in synchronization with a clock edge. The logic output then goes through the output buffer 28 and is output from the external output terminal 29.

Figure 2:
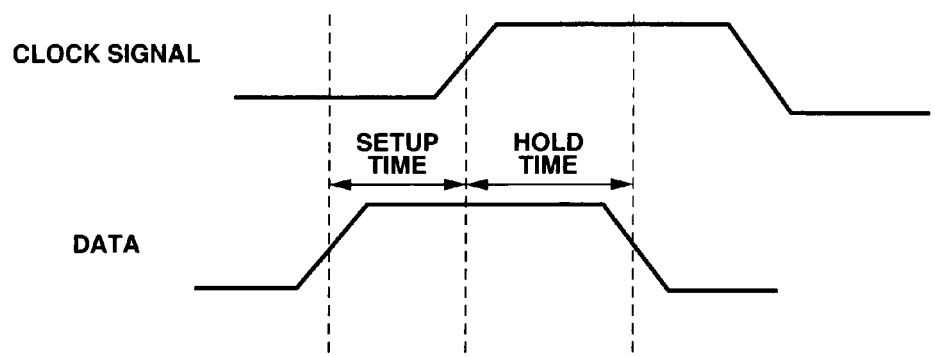
FIG. 2 is a timing diagram showing a relationship between a setup time and a hold time with respect to a valid clock edge.

FIG. 2 shows a relationship between a setup time and a hold time with respect to a valid clock edge of a clock signal. The valid clock edge of the clock signal refers to a level position at which the clock signal has risen or fallen to, for example, a half of the amplitude thereof at an edge (sloped portion) of the clock signal in the rising or falling transition. Thus, a rising edge or a falling edge is defined as a point in the clock signal at which the clock signal has risen or fallen to this level position.

The setup time and the hold time are periods of time on the order of nanoseconds, for example, 1 ns. If the delay time of data is as long as 10 ns with respect to the period of the clock signal (for example, 9 ns), there arises such a problem that the period of the clock signal must be changed to 10 ns in order to secure (maintain) a guaranteed setup time and hold time. Hence, it is important to measure the setup time and the hold time.

According to the first embodiment, data is loaded from the input buffer 12 using the first-stage register circuit 15, and then passed through logic circuits to the register circuit 23 and to the register circuit 25. In the present embodiment, a path formed by using the output of an input buffer (circuit configuration of FIG. 6) is changed to a path (circuit configuration of FIG. 1) formed by using the output of the first-stage register circuit 15 into which the data of the input buffer 12 has been loaded. Accordingly, the path from the input buffer 12 to the first-stage register circuit 15 does not include any complex logic circuits and, therefore, can be simplified. Thus, it is possible to easily make delay adjustments for the purpose of securing a setup time and a hold time at the input stage necessary for system operation. That is, the first-stage register circuit 15 also has a function as an alternative configured to measure the setup time and the hold time of register circuits used in the digital circuit 30.

In addition, since the measurement of the input-stage setup time and hold time is performed without going through the complex logic circuits, there is no need to create a transition pattern covering up to a state of loading data from the input buffer into the first-stage register circuit.

Accordingly, in a semiconductor integrated circuit like a system LSI, a path from an input buffer to a first-stage register circuit does not pass through any branches or a plurality of circuits and, therefore, can be simplified. In addition, by disposing the dedicated output terminal 31 for test output, it is possible to observe the output of the first-stage register circuit.

By simplifying the above-described path, it is possible to make easy post-layout delay adjustments for the purpose of securing a setup time and a hold time at the input stage. In addition, by combining the path with a test output terminal, it is possible to improve the reliability of setup time and hold time measurements at the input stage and shorten measurement time.

Second Embodiment

Figure 3:
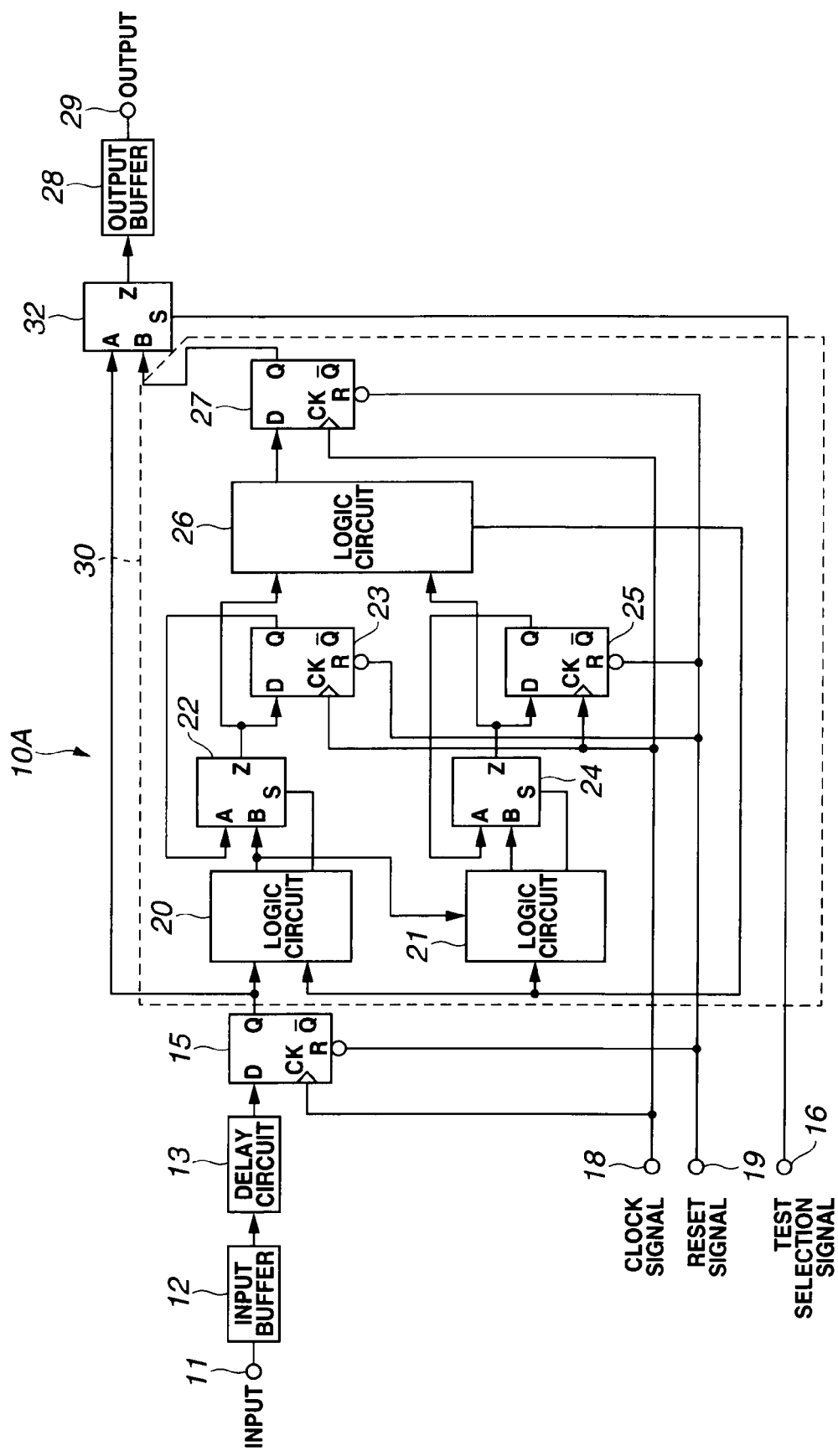
FIG. 3 is a block diagram showing a semiconductor integrated circuit according to a second embodiment of the present invention.

FIG. 3 shows a block diagram of a semiconductor integrated circuit according to a second embodiment of the present invention.

In FIG. 3, a semiconductor integrated circuit 10A is configured in such a manner that the multiplexer 14 located in a stage followed by the first-stage register circuit 15 in FIG. 1 is removed and the OR gate 17 is eliminated, a two-input multiplexer 32 is disposed between the register circuit 27 and the output buffer 28 in the final stage of the digital circuit 30, and either one of the outputs of the first-stage register circuit 15 and the register circuit 27 is selected by the multiplexer 32 and supplied to the output buffer 28. Consequently, it is possible to use the external output terminal 29 also as an output terminal for test data. The rest of the configuration is the same as that of FIG. 1.

The multiplexer 32 includes an input terminal A to which the output of the first-stage register circuit 15 is input, an input terminal B to which the output of the final-stage register circuit 27 is input, an input terminal S to which a test selection signal for electrically connecting either one of the input terminals A and B to an output terminal Z is input, and the output terminal Z for supplying the input of the selected input terminal A or B to the output buffer 28.

At the time of testing, a logical value of, for example, "0" is supplied from an external test selection signal input terminal 16 to the multiplexer 32 as a test selection signal. In this case, the multiplexer 32 connects the input terminal A to the output terminal Z, thereby outputting an output from the first-stage register circuit 15 out of the output terminal 29 through the output buffer 28. At the time of system operation, a logical value of "1" is supplied from the external test selection signal input terminal 16 as a test selection signal. In this case, the multiplexer 32 connects the input terminal B to the output terminal Z, thereby outputting an output from the register circuit 27 in the final stage of the digital circuit 30 out of the output terminal 29 through the output buffer 28.

Figure 4:
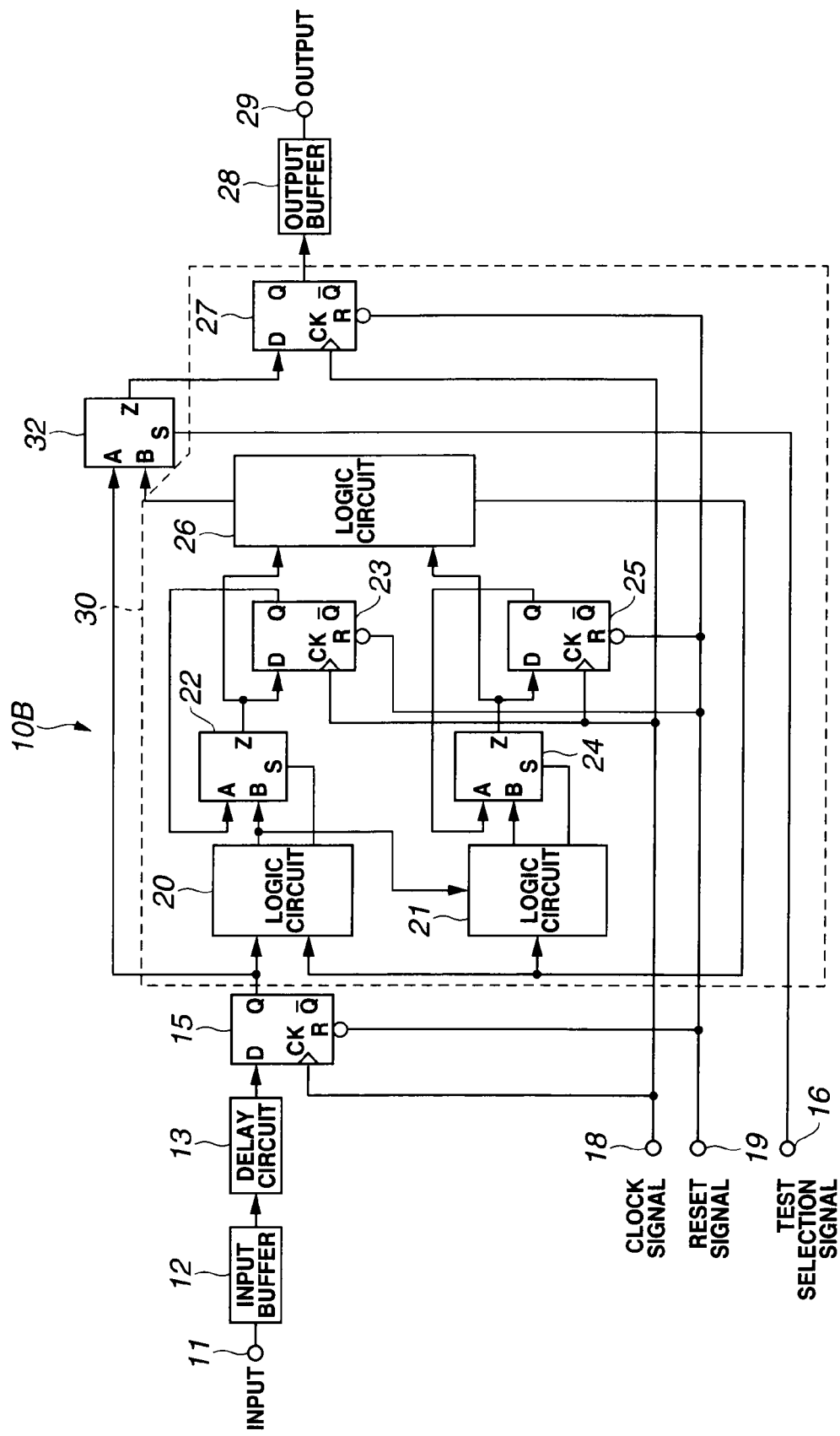
FIG. 4 is a block diagram showing another example of the second embodiment shown in FIG. 3.

FIG. 4 shows a block diagram of another example of the second embodiment of FIG. 3.

A semiconductor integrated circuit 10B shown in FIG. 4 differs in configuration from the semiconductor integrated circuit of FIG. 3 only in the insertion position of the multiplexer 32, i.e., whether the multiplexer 32 is located before or after the final-stage register circuit 27. That is, in FIG. 4, the semiconductor integrated circuit 10B is configured so that the multiplexer 32 is disposed between the logic circuit 26 and the final-stage register circuit 27 of the digital circuit 30.

The multiplexer 32 includes an input terminal A to which the output of the first-stage register circuit 15 is input, an input terminal B to which the output of the logic circuit 26 is input, an input terminal S to which a test selection signal for electrically connecting either one of the input terminals A and B to an output terminal Z is input, and the output terminal Z for supplying the input of the selected input terminal A or B to the input terminal D of the final-stage register circuit 27.

At the time of testing, the multiplexer 32 connects the input terminal A to the output terminal Z, thereby loading an output from the first-stage register circuit 15 into the final-stage register circuit 27 in synchronization with a clock edge, and then outputting the output out of the output terminal 29 through the output buffer 28, if a logical value of, for example, "0" is supplied from an external test selection signal input terminal 16 as a test selection signal. At the time of system operation, the multiplexer 32 connects the input terminal B to the output terminal Z, thereby loading an output from the logic circuit 26 within the digital circuit 30 into the final-stage register circuit 27 in synchronization with a clock edge, and then outputting the output out of the output terminal 29 through the output buffer 28, if a logical value of "1" is supplied from the external test selection signal input terminal 16 as a test selection signal.

A selection as to whether the configuration of FIG. 3 or the configuration of FIG. 4 is adopted may be made according to the specifications of LSI development.

According to the second embodiment, it is possible to directly observe the output of the first-stage register circuit 15 after easily loading data from the input buffer 12 using the first-stage register circuit 15, without having to go through the logic circuit 26. Consequently, there is no need to create a pattern for letting data make a transition from the first-stage register circuit 15 up to the output buffer 28.

In addition, it suffices to observe one output alone, rather than observing the outputs of a plurality of register circuits. Furthermore, since observations can be performed without being affected by the transition state of internal resister circuits or the circuit configuration, it is possible to improve the reliability of setup time and hold time measurements at an input stage.

Third Embodiment

Figure 5:
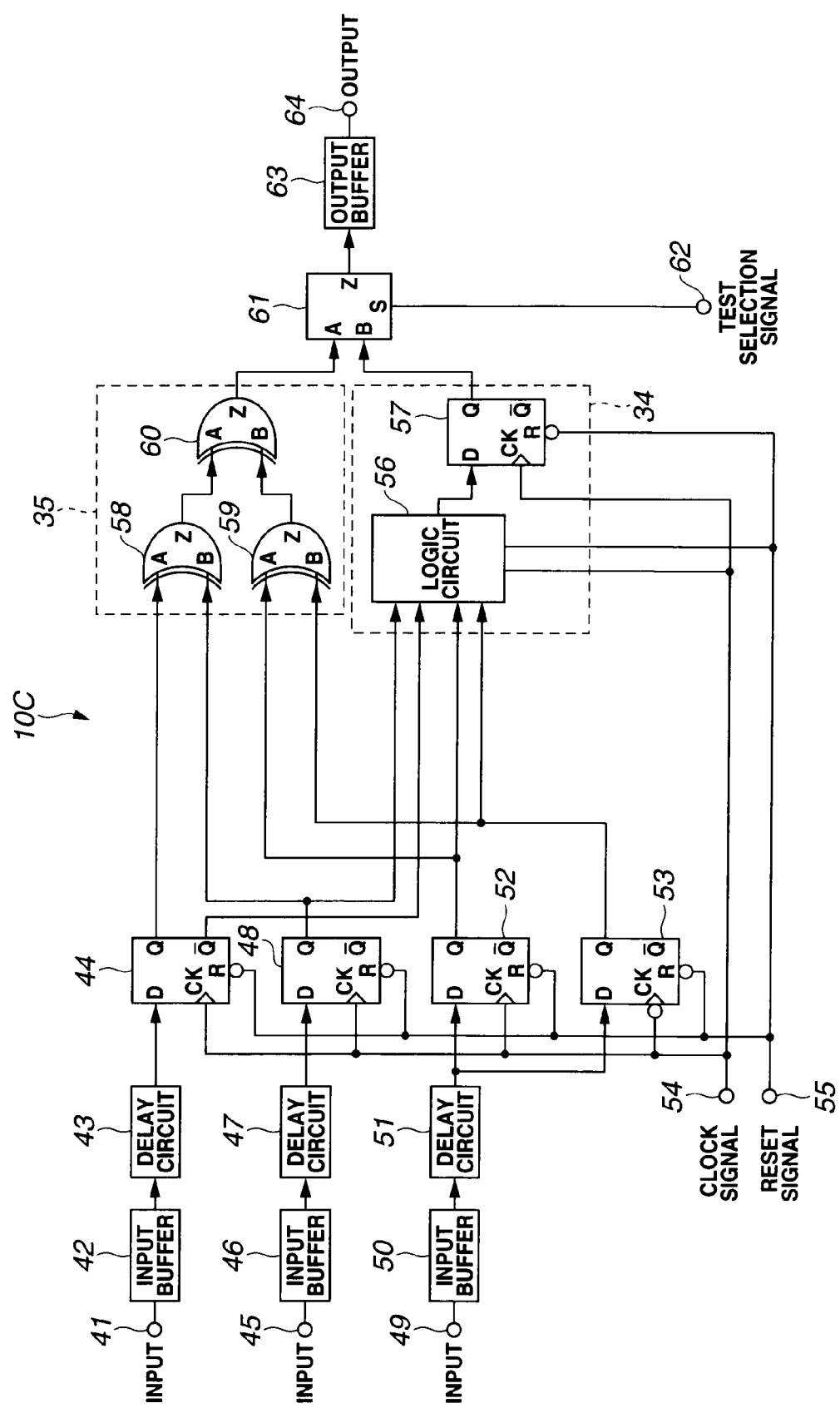
FIG. 5 is a block diagram showing a semiconductor integrated circuit according to a third embodiment of the present invention.

FIG. 5 shows a block diagram of a semiconductor integrated circuit according to a third embodiment of the present invention. A semiconductor integrated circuit 10C shown in the present embodiment includes a plurality of external input terminals 41, 45 and 49 to which input data can be input; a plurality of input buffers 42,46 and 50; a plurality of delays 43,47 and 51; a plurality of first-stage register circuits 44,48, 52 and 53; a digital circuit 34 connected to these first-stage register circuits; a combinational logic circuit 35 configured with a plurality of EXCLUSIVE-OR circuits (EXORs) 58 to 60 configured to supply only the operating output of one first-stage register circuit, among the plurality of first-stage register circuits 44,48,52 and 53, as a test output to one input terminal A of a multiplexer 61; a clock signal input terminal 54; a reset signal input terminal 55; the multiplexer 61 which includes an input terminal A to which a test output from the EXOR 60 is input, an input terminal B to which the output of a register circuit 57 within a digital circuit 34 is input, an input terminal S to which a test selection signal is input, and an output terminal Z, thereby selecting the input of either one of the input terminals A and B and outputting the input to the output terminal Z; a test selection signal input terminal 62; an output buffer 63; and an external output terminal 64 from which output data is output.

Note that the digital circuit 34 is the digital circuit common to the plurality of first-stage register circuits 44, 48, 52 and 53, and is configured only with one logic circuit 56 and one output-stage register circuit 57 configured to load the logic output of the logic circuit 56. That is, the digital circuit 34 serves equivalently as in a case where four digital circuits having the same configuration are provided for the four first-stage register circuits 44, 48, 52, and 53. However, the semiconductor integrated circuit 10C may alternatively have a configuration in which are disposed a plurality of digital circuits for system operation connected to the plurality of first-stage register circuits 44,48,52 and 53, respectively, without providing such a common digital circuit as described above, and a multi-input multiplexer 61' which receives, as the input thereof, the outputs of a plurality of those digital circuits and the outputs of the first-stage register circuits from the combinational logic circuit 35 at the time of testing.

Also note that the two first-stage register circuits 52 and 53, among the plurality of first-stage register circuits 44, 48, 52 and 53, commonly load input data from the same input terminal 49 and the same input buffer 50 in synchronization with a clock edge. Specifically, the semiconductor integrated circuit 10C is configured so that the first-stage register circuit 52 loads the input data in synchronization with a rising edge of a clock signal, whereas the first-stage register circuit 53 loads the input data in synchronization with a falling edge of the clock signal.

In the above-described configuration, input data (a signal alternating between "0" and "1" with time) is input only to an input terminal (for example, the input terminal 41), among the input terminals 41, 45 and 49, corresponding to an first-stage register circuit to be tested at the time of testing performed to observe the outputs of the first-stage register circuits. In addition, a fixed value (a signal having a logical value of either "0" or "1" that does not change with time, for example, a "0" signal) is input to other input terminals 45 and 49. Consequently, only the data output from the first-stage register circuit 44 under test passes through the combinational logic circuit 35 and is supplied to the input terminal A of the multiplexer 61. Since a logical value of "0" is supplied from the test selection signal input terminal 62 at the time of testing, the multiplexer 61 selects the input terminal A between the input terminals A and B. Consequently, observation data is output from the external output terminal 64 through the output terminal Z and the output buffer 63.

Assuming that input data (a signal alternating between "0" and "1" with time) is input only to, for example, the input terminal 41, also at the time of system operation, then inverted data output from the inverting output terminal /Q of the first-stage register circuit 44 is subjected to logical operations by the logic circuit 56 and is output therefrom. The output data is further loaded into the output-stage register circuit 57 and then supplied to the input terminal B of the multiplexer 61. Since a logical value of "1" is supplied from the test selection signal input terminal 62, the multiplexer 61 selects the input terminal B between the input terminals A and B. Consequently, operating output data is output from the external output terminal 64 through the output terminal Z and the output buffer 63.

According to the third embodiment, if there is a plurality of such semiconductor integrated circuits as shown in FIGS. 1 to 3 but it is not possible to secure a plurality of observation-purpose test output terminals for the plurality of semiconductor integrated circuits, the outputs of the plurality of first-stage register circuits of the plurality of semiconductor integrated circuits are grouped using a combinational logic circuit configured with a plurality of EXORs. Consequently, it is possible to take out the output of a first-stage register circuit to be measured from one output terminal, and measure the output. In this case, the output of only one first-stage register circuit can be observed at a time for each input buffer and each clock edge. By such means as described above, however, it is possible to reduce the number of test output terminals.

As has been described heretofore, according to the present invention, a path from an input buffer to a first-stage register circuit necessary for system operation is made common. This makes it easy to perform delay adjustments necessary to guarantee an input-stage setup time and hold time for the first-stage register circuit. The period of LSI development can thus be reduced. The first-stage register circuit has a function as a measurement-purpose alternative configured to measure the setup time and hold time of a register circuit used within a digital circuit.

Furthermore, the present invention makes it easy for a first-stage register circuit, the setup time and hold time of which is to be measured at an input stage, to be prepared for a state transition. In addition, the present invention makes it possible to directly observe the output of the first-stage register circuit. Consequently, there is no need to create any complex patterns and extra patterns for measurement. Thus, it is possible to reduce the lead time of measurement and measurement time. In addition, it is possible to reliably measure the setup time and the hold time at the input stage.

Having described the embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A semiconductor integrated circuit comprising:
   a digital circuit which includes a logic circuit configured to perform logical operations on supplied data and a register circuit configured to temporarily retain a logic output from the logic circuit; and
   a first-stage register circuit provided in a stage followed by the digital circuit and having a function as an alternative circuit configured to test the register circuit and a function as an interface which supplies input data loaded from an external input terminal to the digital circuit in synchronization with an edge of a clock signal, wherein the loaded data is supplied to the digital circuit at a time of system operation or the loaded data is output to an external output terminal of the digital circuit through a dedicated output terminal or through a path bypassing the digital circuit at a time of testing;
   wherein the testing is to measure setup time and hold time of the register circuit.

2. The semiconductor integrated circuit according to claim 1, further comprising a selection circuit outputting the output of the digital circuit and the output of the first-stage register circuit respectively at the time of system operation and at the time of testing.

3. The semiconductor integrated circuit according to claim 1, further comprising a delay circuit configured to adjust the timing of input data to be supplied from the external input terminal to the first-stage logic circuit.

4. The semiconductor integrated circuit according to claim 2, further comprising a delay circuit configured to adjust the timing of input data to be supplied from the external input terminal to the first-stage logic circuit.

5. The semiconductor integrated circuit according to claim 1, wherein the first-stage register circuit is provided in plural number and further comprising a combinational logic circuit to which output lines of the plurality of first-stage register circuits are connected as input lines, for enabling only output of one active first-stage register circuit among the plurality of first-stage register circuits to be selectively output, thereby enabling the output of each of the first-stage register circuits to be observed by outputting only the output of the one active first-stage register circuit from one output terminal.

6. The semiconductor integrated circuit according to claim 2, wherein the first-stage register circuit is provided in plural number and further comprising a combinational logic circuit to which output lines of the plurality of first-stage register circuits are connected as input lines, for enabling only output of one active first-stage register circuit among the plurality of first-stage register circuits to be selectively output, thereby enabling the output of each of the first-stage register circuits to be observed by outputting only the output of the one active first-stage register circuit from one output terminal.

7. The semiconductor integrated circuit according to claim 3, wherein the first-stage register circuit is provided in plural number and further comprising a combinational logic circuit to which output lines of the plurality of first-stage register circuits are connected as input lines, for enabling only output of one active first-stage register circuit among the plurality of first-stage register circuits to be selectively output, thereby enabling the output of each of the first-stage register circuits to be observed by outputting only the output of the one active first-stage register circuit from one output terminal.

8. The semiconductor integrated circuit according to claim 5, wherein the combinational logic circuit is configured by combining a plurality of EXCLUSIVE-OR circuits.

9. The semiconductor integrated circuit according to claim 6, wherein the combinational logic circuit is configured by combining a plurality of EXCLUSIVE-OR circuits.

* * * * *